(12) United States Patent
Roberts

(10) Patent No.: US 6,670,207 B1
(45) Date of Patent: Dec. 30, 2003

(54) RADIATION EMITTER DEVICE HAVING AN INTEGRAL MICRO-GROOVE LENS

(75) Inventor: John K. Roberts, East Grand Rapids, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

(21) Appl. No.: 10/078,906

(22) Filed: Feb. 19, 2002

Related U.S. Application Data

(60) Continuation-in-part of application No. 09/935,443, filed on Aug. 23, 2001, which is a division of application No. 09/426,795, filed on Oct. 22, 1999, now Pat. No. 6,335,548

(60) Provisional application No. 60/270,054, filed on Feb. 19, 2001, and provisional application No. 60/124,493, filed on Mar. 15, 1999.

(51) Int. Cl.[7] ........................... H01L 33/00; H01L 21/56
(52) U.S. Cl. ........................................... 438/27; 438/28
(58) Field of Search ....................... 438/26, 27, 28, 438/35, FOR 416; 264/242.17; 257/E33.059

(56) References Cited

U.S. PATENT DOCUMENTS

| | | | |
|---|---|---|---|
| 4,125,777 A | | 11/1978 | O'Brien et al. |
| 4,267,559 A | | 5/1981 | Johnson et al. |
| 4,486,364 A | * | 12/1984 | Takahashi .................. 264/1.7 |
| H445 H | * | 3/1988 | Bock et al. .................. 264/1.7 |
| 4,809,053 A | * | 2/1989 | Kuraishi ..................... 257/675 |
| 5,032,898 A | * | 7/1991 | Bowen et al. ............... 257/433 |
| 5,055,892 A | * | 10/1991 | Gardner et al. .............. 257/99 |
| 5,057,903 A | * | 10/1991 | Olla .......................... 257/707 |
| 5,113,232 A | * | 5/1992 | Itoh et al. ..................... 257/91 |
| 5,130,531 A | | 7/1992 | Ito et al. |
| 5,173,839 A | * | 12/1992 | Metz, Jr. .................... 361/706 |
| 5,289,082 A | | 2/1994 | Komoto |
| 5,381,042 A | * | 1/1995 | Lerner et al. ............... 257/712 |
| 5,442,234 A | * | 8/1995 | Liang ........................ 257/675 |
| 5,491,362 A | * | 2/1996 | Hamzehdoost et al. ..... 257/712 |
| 5,660,461 A | | 8/1997 | Ignatius et al. |
| 5,803,579 A | | 9/1998 | Turnbull et al. |
| 5,808,325 A | | 9/1998 | Webb |
| 5,851,449 A | * | 12/1998 | Uchino et al. ............... 264/1.7 |
| 5,869,883 A | * | 2/1999 | Mehringer et al. ......... 257/667 |
| 5,966,393 A | | 10/1999 | Hide et al. |
| 6,335,548 B1 | | 1/2002 | Roberts et al. |

OTHER PUBLICATIONS

U.S. patent application Publication No. 2001/0026011, Oct. 4, 2001.

* cited by examiner

*Primary Examiner*—George Fourson
(74) *Attorney, Agent, or Firm*—Price, Heneveld, Cooper, DeWitt & Litton

(57) ABSTRACT

The radiation emitter device of the present invention includes at least two radiation emitters emitting radiation of different wavelengths, first and second electrical leads electrically coupled to at least one of the radiation emitters, and an encapsulant configured to encapsulate the radiation emitters and a portion of the first and second electrical leads. The encapsulant is further configured to have a surface defining an optical lens including a plurality of concentric circular grooves. The optical lens is preferably a divergent lens. Preferably, the lens is a multi-faceted Fresnel lens structure having a plurality of risers and Fresnel facets defining the plurality of concentric circular grooves. The radiation emitter device may further include a secondary reflective cup, preferably a parabolic or elliptical reflective cup, disposed proximate the encapsulant about the periphery of the Fresnel lens structure.

17 Claims, 7 Drawing Sheets

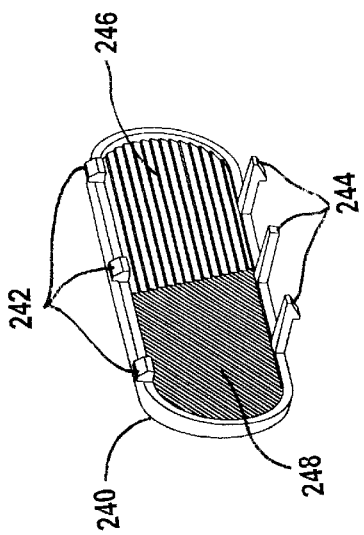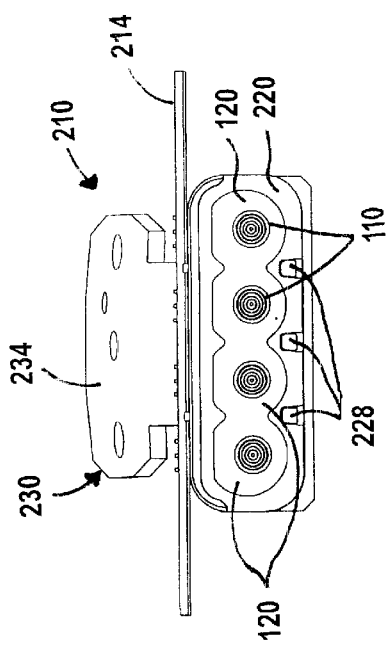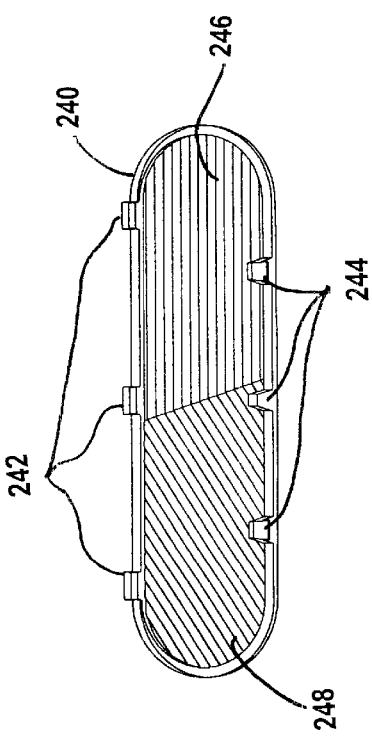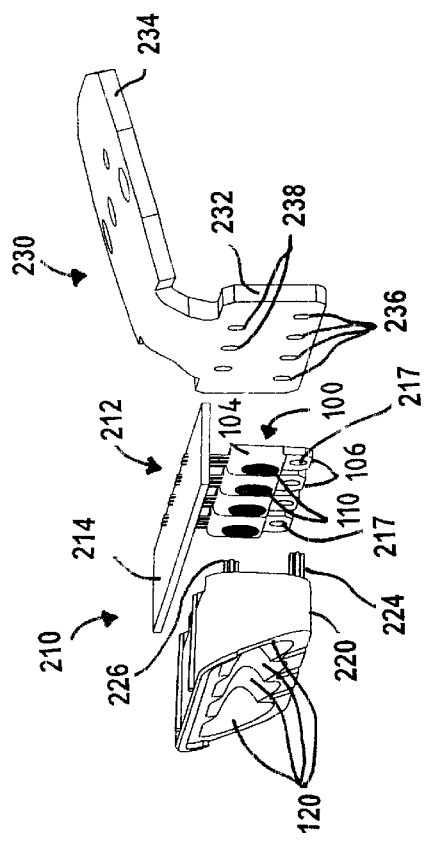

RADIATION EMITTER DEVICE HAVING AN INTEGRAL MICRO-GROOVE LENS

CROSS-REFERENCE TO RELATED APPLICATIONS

This application claims priority under 35 U.S.C. §119(e) on U.S. Provisional Patent Application No. 60/270,054, entitled "RADIATION EMITTER DEVICE HAVING A MICRO-GROOVE LENS," filed on Feb. 19, 2001, by John K. Roberts, the entire disclosure of which is incorporated herein by reference.

This application is also a continuation-in-part of U.S. patent application Ser. No. 09/935,443, Application Publication No. US 2002-0004251, filed on Aug. 23, 2001, entitled "METHOD OF MAKING A SEMICONDUCTOR RADIATION EMITTER PACKAGE," by John K. Roberts et al., which is a divisional application of U.S. patent application Ser. No. 09/426,795, filed on Oct. 22, 1999, entitled "SEMICONDUCTOR RADIATION EMITTER PACKAGE," by John K. Roberts et al., now U.S. Pat. No. 6,335,548, which claims priority under 35 U.S.C. §119(e) on U.S. Provisional Patent Application No. 60/124,493, entitled "SEMICONDUCTOR RADIATION EMITTER PACKAGE," filed on Mar. 15, 1999, by John K. Roberts et al. The entire disclosures of these applications and patent are incorporated herein by reference.

BACKGROUND OF THE INVENTION

The present invention generally relates to radiation emitter devices such as, for example, light emitting diode (LED) packages, and more particularly to opto-electronic emitter assemblies incorporating a plurality of optical radiation emitter devices.

As used herein, the term "discrete opto-electronic emitter assembly" means packaged radiation emitter devices that emit ultraviolet (UV), visible, or infrared (IR) radiation upon application of electrical power. Such discrete opto-electronic emitter assemblies include one or more radiation emitters. Radiation emitters, particularly optical radiation emitters, are used in a wide variety of commercial and industrial products and systems, and accordingly come in many forms and packages. As used herein, the term "optical radiation emitter" includes all emitter devices that emit visible light, near IR radiation, and UV radiation. Such optical radiation emitters may be pyrroluminescent, photoluminescent, electroluminescent, or other solid state emitter. Photoluminescent sources include phosphorescent and fluorescent sources. Fluorescent sources include phosphors and fluorescent dyes, pigments, crystals, substrates, coatings, and other materials.

Electroluminescent sources include semiconductor optical radiation emitters, and other devices that emit optical radiation in response to electrical excitation. Semiconductor optical radiation emitters include light emitting diode (LED) chips, light emitting polymers (LEPs), organic light emitting devices (OLEDs), polymer light emitting devices (PLEDs), etc.

Semiconductor optical emitter components, particularly LED devices, have become commonplace in a wide variety of consumer and industrial opto-electronic applications. Other types of semiconductor optical emitter components, including OLEDs, LEPs, and the like, may also be packaged in discrete components suitable as substitutes for conventional inorganic LEDs in many of these applications.

Visible LED components of all colors are used alone or in small clusters as status indicators on such products as computer monitors, coffee makers, stereo receivers, CD players, VCRs, and the like. Such indicators are also found in a diversity of systems such as instrument panels in aircraft, trains, ships, cars, trucks, minivans and sport utility vehicles, etc. Addressable arrays containing hundreds or thousands of visible LED components are found in moving-message displays such as those found in many airports and stock market trading centers and also as high brightness large-area outdoor television screens found in many sports complexes and in some urban billboards.

Amber, red, and red-orange emitting visible LEDs are used in arrays of up to 100 components in visual signaling systems such as vehicle center high mounted stop lamps (CHMSLs), brake lamps, exterior turn signals and hazard flashers, exterior signaling mirrors, and for roadway construction hazard markers. Amber, red, and blue-green emitting visible LEDs are increasingly being used in much larger arrays of up to 400 components as stop/slow/go lights at intersections in urban and suburban intersections.

Multi-color combinations of pluralities of visibly colored LEDs are being used as the source of projected white light for illumination in binary-complementary and ternary RGB illuminators. Such illuminators are useful as vehicle or aircraft maplights, for example, or as vehicle or aircraft reading or courtesy lights, cargo lights, license plate illuminators, backup lights, and exterior mirror puddle lights. Other pertinent uses include portable flashlights and other illuminator applications where rugged, compact, lightweight, high efficiency, long-life, low voltage sources of white illumination are needed. Phosphor-enhanced "white" LEDs may also be used in some of these instances as illuminators.

Blue, violet, and UV emitting LEDs and LED lasers are being used extensively for data storage and retrieval applications such as reading and writing to high-density optical storage disks.

Opto-electronic radiation emitters and particularly LED devices are known to utilize more than one radiation emitter (i.e., LED chip). An example of such a structure is shown in FIG. 1. As illustrated, two LED chips 1 are mounted on a common electrical lead of a lead frame 2 and have wire bonds 3 attaching their other contact terminals to independent electrical leads of lead frame 2. An encapsulant 4 encapsulates the LEDs, wire bonds, and a significant portion of the leads so as to retain the physical integrity of the structure. As shown in FIG. 1, one end of encapsulant 4 has an outward-convex spherical surface 5 to serve as a lens at the light exit surface. The optical axis and focus of spherical surface 5 is typically centered between LED chips 1. Such an arrangement is problematic in that neither LED chip 1 is disposed at the focal point or on the central axis of spherical lens surface 5. This has the undesirable effect of magnifying and projecting an image of the LED chips at a distance from the LED device. Thus, if LED chips 1 emit light of different colors, a person looking directly at the LED device from a distance will clearly see two different color images of the LED chip point sources as magnified by lens 5. When the different colors from the LED chips are desired to mix so as to provide a different color, the ability of an observer to see the two different colored chips from a distance may render the device unsuitable for certain applications. For example, when a binary-complementary or ternary RGB chip set is utilized to provide effective white light for use as an indicator, a person looking directly at the indicator will see spots corresponding to the component colors of the device. When a binary-complementary or ternary RGB chip set is utilized to provide effective white light for use as an illuminator, the illuminator will project the magnified image of the differently colored LED chips such that the illuminating light is not uniformly white across the area of projected illumination.

The above imaging problem also can be present when one of the radiation emitters is an LED chip and the other radiation emitter is a photoluminescent material that is incorporated within the encapsulant or within a glob top over the LED chip. In such devices, the light emitted from the LED chip may not strike the photoluminescent material uniformly thereby exciting the photoluminescent material in a non-uniform fashion resulting in non-uniform light emission from the photoluminescent material. Further, the photoluminescent material may not be uniformly dispersed throughout the encapsulant thereby further exasperating the problem.

U.S. Pat. No. 5,289,082 addresses the problem in utilizing two or three LED chips a and proposes an encapsulant lens structure having elliptically segmented portions, with each portion aligned with respect to one of the LED chips and having its focal point at the corresponding LED chip position. While this approach may ameliorate the above problem, it nevertheless does not sufficiently overcome the problem so as to render a multi-chip LED device suitable for all applications where color mixing is required.

Accordingly, there is a need for an opto-electronic emitter device that includes a plurality of radiation emitters, whether electroluminescent and/or photoluminescent, that sufficiently disperses the light with a required intensity at a distance while not separating the images of the radiation emitters so as to create images of the two or three component colors.

SUMMARY OF THE INVENTION

Accordingly, an opto-electronic emitter device has been designed to overcome the above problems and to provide an effective illuminator/indicator device. To achieve these and other aspects and advantages, the radiation emitter device of the present invention comprises at least two radiation emitters emitting radiation of different wavelengths, first and second electrical leads electrically coupled to at least one of the radiation emitters, and an encapsulant configured to encapsulate the radiation emitters and a portion of the first and second electrical leads. The encapsulant is further configured to have a surface defining an optical lens including a plurality of concentric circular grooves. The optical lens is preferably divergent.

According to a preferred embodiment of the present invention, the divergent lens is a multi-faceted Fresnel lens structure having a plurality of risers and Fresnel facets defining the plurality of concentric circular grooves.

According to another embodiment of the present invention, a radiation emitter assembly comprises: at least one radiation emitter device comprising: at least two radiation emitters emitting radiation of different wavelengths; first and second electrical leads electrically coupled to at least one of the radiation emitters; and an encapsulant configured to encapsulate the radiation emitters and a portion of the first and second electrical leads. The encapsulant is further configured to have a surface defining a divergent optical lens. The radiation emitter assembly further includes a secondary reflective cup disposed proximate the divergent optical lens of the radiation emitter device.

According to another embodiment of the present invention, a map lamp assembly for a vehicle rearview mirror is provided that comprises: at least one radiation emitter device comprising: at least two radiation emitters emitting radiation of different wavelengths; first and second electrical leads electrically coupled to at least one of the radiation emitters; and an encapsulant configured to encapsulate the radiation emitters and a portion of the first and second electrical leads. The encapsulant is further configured to have a surface defining a divergent optical lens. The radiation emitter assembly further includes a secondary reflective cup disposed proximate the divergent optical lens of the radiation emitter device.

These and other features, advantages, and objects of the present invention will be further understood and appreciated by those skilled in the art by reference to the following specification and appended drawings.

BRIEF DESCRIPTION OF THE DRAWINGS

In the drawings:

FIG. 8 is a perspective view showing the inside surface of a secondary lens used with the map lamp assembly shown in FIG. 7;

FIG. 9 is another perspective view showing the inside surface of the secondary lens shown in FIG. 6;

FIG. 10 is an exploded perspective view of the map lamp assembly shown in FIG. 7; and FIG. 11 is a plan view showing the bottom of the map lamp assembly shown in FIGS. 7 and 10.

DETAILED DESCRIPTION OF THE PREFERRED EMBODIMENTS

Figure 1:
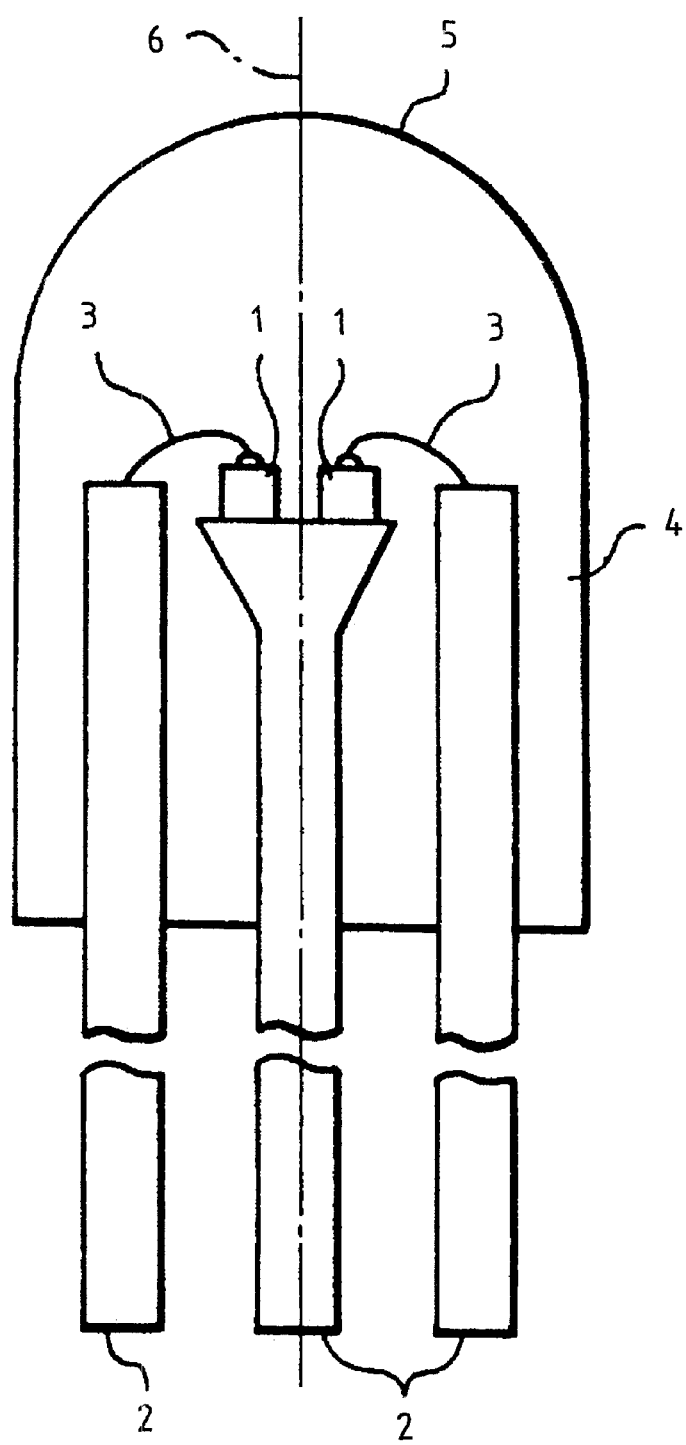
FIG. 1 is a sectional view of a conventional multi-chip LED device.

Reference will now be made in detail to the present preferred embodiments of the invention, examples of which are illustrated in the accompanying drawings. Wherever possible, the same reference numerals will be used throughout the drawings to refer to the same or like parts.

For purposes of description herein, the terms "upper," "lower," "right," "left," "rear," "front," "vertical," "horizontal," "top," "bottom," and derivatives thereof shall relate to the invention as viewed by a person looking directly at the radiation emitting device along the principal optical axis of the source. However, it is to be understood that the invention may assume various alternative orientations, except where expressly specified to the contrary. It is also to be understood that the specific device illustrated in the attached drawings and described in the following specification is simply an exemplary embodiment of the inventive concepts defined in the appended claims. Hence, specific dimensions, proportions, and other physical characteristics relating to the embodiment disclosed herein are not to be considered as limiting, unless the claims expressly state otherwise.

Several embodiments of the present invention generally relate to an improved optical radiation emitting device useful in both high and low power applications. Such embodiments of the present invention are particularly well suited for use in limited power applications such as vehicles, portable lamps, and specialty lighting. By vehicles, we mean over-land vehicles, watercraft, aircraft and manned spacecraft, including but not limited to automobiles, trucks, vans, buses, recreational vehicles (RVs), bicycles, motorcycles and mopeds, motorized carts, electric cars, electric carts, electric bicycles, ships, boats, hovercraft, submarines, airplanes, helicopters, space stations, shuttlecraft, and the like. By portable lamps, we mean camping lanterns, head or helmet-mounted lamps such as for mining, mountaineering, and spelunking, hand-held flashlights, and the like. By specialty lighting we mean emergency lighting activated during power failures, fires or smoke accumulations in buildings, microscope stage illuminators, billboard frontlighting, backlighting for signs, etc. The light emitting assembly of the present invention may be used as either an illuminator or an indicator. Examples of some of the applications in which the present invention may be utilized are disclosed in commonly assigned U.S. patent application Ser. No. 09/425,792 entitled "INDICATORS AND ILLUMINATORS USING A SEMICONDUCTOR RADIATION EMITTER PACKAGE," filed on Oct. 29, 2000, by John K. Roberts et al., now U.S. Pat. No. 6,441,943, the entire disclosure of which is incorporated herein by reference.

Some of the embodiments of the present invention provide a highly reliable, low-voltage, long-lived light source for vehicles, portable lighting, and specialty lighting capable of producing white light with sufficient luminous intensity to illuminate subjects of interest well enough to be seen and to have sufficient apparent color and contrast so as to be readily identifiable. Several of the radiation emitter devices of the present invention may be well suited for use with AC or DC power sources, pulse-width modulated DC power sources, and electronic control systems. The radiation emitting devices of the present invention may further be used to emit light of various colors.

As used herein, the term "radiation emitter" and "radiation emitting device" shall include any structure that generates and emits optical or non-optical radiation, while the term "optical radiation emitter" or "optical radiation emitting device" includes those radiation emitters that emit optical radiation, which includes visible light, near infrared (IR) radiation, and/or ultraviolet (UV) radiation. As noted above, optical radiation emitters may include electroluminescent sources or other solid-state sources and/or photoluminescent or other sources. One form of electroluminescent source includes semiconductor optical radiation emitters. For purposes of the present invention, "semiconductor optical radiation emitters" comprise any semiconductor component or material that emits electromagnetic radiation having a wavelength between 100 nm and 2000 nm by the physical mechanism of electroluminescence upon passage of electrical current through the component or material. The principle function of a semiconductor optical radiation emitter within the present invention is the conversion of conducted electrical power to radiated optical power. A semiconductor optical radiation emitter may include a typical IR, visible or UV LED chip or die well known in the art and used in a wide variety of prior art devices, or it may include any alternate form of semiconductor optical radiation emitter as described below.

Alternate forms of semiconductor optical radiation emitters which may be used in the present invention are light emitting polymers (LEPs), polymer light emitting diodes (PLEDs), organic light emitting diodes (OLEDs), and the like. Such materials and opto-electronic structures made from them are electrically similar to traditional inorganic LEDs, but rely on organic compositions such as derivatives of the conductive polymer polyaniline for electroluminescence. Such semiconductor optical radiation emitters are relatively new, but may be obtained from sources such as Cambridge Display Technology, Ltd. of Cambridge, and from Uniax of Santa Barbara, Calif.

For brevity, the term "semiconductor optical radiation emitter" may be substituted with the term "LED" or the alternate forms of emitters described above or known in the art. Examples of emitters suitable for the present invention include varieties of LED chips with associated conductive vias and pads for electrical attachment and that are emissive principally at P-N junctions within doped inorganic compounds of AlGaAs, AlInGaP, GaAs, GaP, InGaN, AlInGaN, GaN, SiC, ZnSe, and the like.

LEDs are a preferred electroluminescent light source for use in the radiation emitting devices of the present invention because LEDs do not suffer appreciable reliability or fieldservice life degradation when mechanically or electronically switched on and off for millions of cycles. The luminous intensity and illuminants from LEDs closely approximate a linear response function with respect to applied electrical current over a broad range of conditions, making control of their intensity a relatively simple matter. Finally, recent generations of AlInGaP, AlGaAs, InGaN, AlInGaN, and GaN LEDs draw less electrical power per lumen or candela of visible light produced than incandescent lamps, resulting in more cost-effective, compact, and lightweight illuminator wiring harnesses, fuses, connectors, batteries, generators, alternators, switches, electronic controls, and optics. A number of examples have previously been mentioned and are incorporated within the scope of the present invention, although it should be recognized that the present invention has other obvious applications beyond the specific ones mentioned which do not deviate appreciably from the teachings herein and therefore are included in the scope of this invention.

Another preferred radiation source that may be used in the inventive light emitting assembly is a photoluminescent source. Photoluminescent sources produce visible light by partially absorbing visible or invisible radiation and re-emitting visible radiation. Photoluminescent sources are phosphorescent and fluorescent materials, which include fluorescent dyes, pigments, crystals, substrates, coatings, as well as phosphors. Such a fluorescent or phosphorescent material may be excited by an LED or other radiation emitter and may be disposed within or on the LED, or within or on a separate optical element, such as a lens or diffuser that is not integral with an LED.

In most opto-electronic emitter devices, the radiation emitter is embedded in an encapsulant media (solid, liquid, gel, or a combination thereof) that possesses a refractive index greater than air. As such, if the exit surface of the encapsulant media along the device optical axis is piano, then the exit surface could be considered a divergent optical surface. The ray fan exiting this surface outward from the radiation emitter would subtend a wider angle than the ray fan entering this surface.

If a spherical, aspheric, or other convex-outward surface is instead used as the exit surface, then the surface can be made to function as a collimating or partially collimating optical surface. The ray fan exiting this surface outward from the radiation source would subtend an angle less than or equal to the ray fan entering this surface. If the radius of curvature of such a convex-outward surface is low enough, then the surface can be made to function as a convergent lens.

If a spherical, aspheric, or other concave-inward surface is instead used as the exit surface, then the surface can be made to function as a super-divergent optical surface. The ray fan exiting this surface outward from the radiation source would subtend an angle substantially more than the ray fan entering this surface.

In a preferred embodiment of the present invention, a hybridized divergent lens design is utilized. The starting exit surface is mildly convexed outward and placed so the radiation source is off the focal plane (such that the surface is less divergent a surface than a plano surface, but not curved enough to collimate the ray fan). This mildly convex surface is then converted to a faceted Fresnel structure. Then, the risers of the Fresnel facets are adjusted to be substantially parallel to rays from the radiation emitter thereby improving efficiency and providing mold-draft. Then, the Fresnel facets (arc shaped in cross section) are flattened (arcs replaced by lines approximating them in cross section). The resultant lens provides a non-imaging, mildly divergent lens structure. A diffusant may be added to the encapsulant or applied to the surface of the lens to improve color mixing of the light emitted from the encapsulated emitters.

Figure 7:
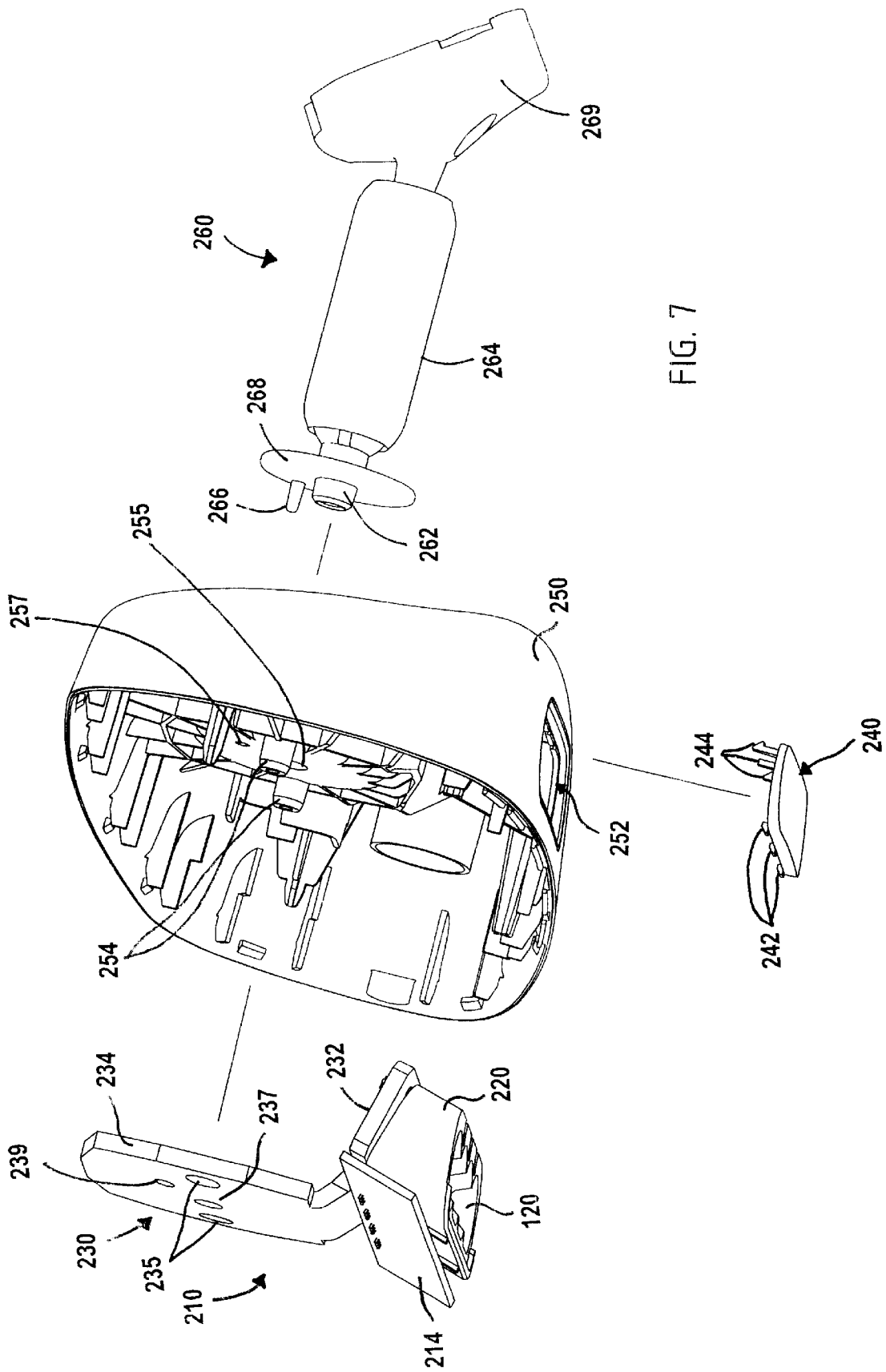
FIG. 7 is an exploded perspective view of a portion of a rearview mirror assembly having a map light assembly incorporating the inventive radiation emitter device.

The output of this device may be collected with a secondary optic (such as a reflector) to produce a higher intensity beam. In a preferred embodiment of such a system, the reflector is a parabolic or elliptical surface. Other secondary optics may additionally or optionally be used in or with the device. These may include diffusers, lenses, photoluminescent media, and the like. By utilizing a divergent integral lens and a reflector, the divergent lens prevents direct magnification of the images of the emitter die and provides for improved mixing of the different colored light emitted from the die. The reflector serves to collect and collimate the mixed light and direct the light towards the area to be illuminated. Additional mixing and redirecting of light may be achieved by utilizing a secondary optic element in addition to the reflector. An example of such a structure is shown in FIG. 7 and described below.

Figure 2:
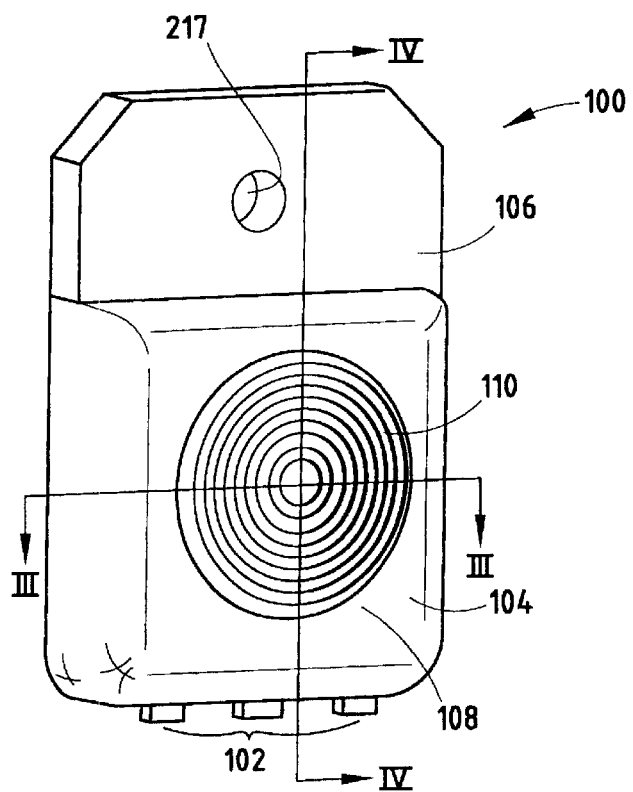
FIG. 2 is a perspective view of a radiation emitter device constructed in accordance with the present invention.

FIG. 2 is a perspective view of a radiation emitter device constructed in accordance with the present invention. As shown, device 100 includes first, second, and third electrical leads 102 extending out one side of an encapsulant 104. Extending out an opposite end of encapsulant 104 from leads 102 is a heat extraction member 106. Preferably, the plurality of radiation emitters (not shown) is attached to a surface of heat extraction member 106, which extends into the encapsulation 104. Most preferably, heat extraction member 106 includes an integral reflective cup 107 (FIGS. 3 and 4) in which three LED chips 105 are attached. In the most preferred embodiment, one blue-green LED chip is mounted in the center of reflective cup 107 and two amber LED chips are mounted on either side of the blue-green LED chip. Detailed construction of the assembly discussed thus far is disclosed in commonly assigned U.S. Pat. No. 6,335,548 entitled "SEMICONDUCTOR RADIATION EMITTER PACKAGE," filed on Oct. 22, 1999, by John K. Roberts et al. The entire disclosure of this application is incorporated herein by reference. As shown in FIG. 2, encapsulant 104 is preferably molded to define a light exit surface 108 on which the micro-groove lens 110 is formed. Preferably, the center of lens 110 lies over a central point between the plurality of radiation emitters encapsulated within encapsulant 104. In a most preferred embodiment of the present invention, two LED chips are encapsulated in encapsulant 102 with the first LED chip emitting blue-green light and the second LED chip emitting amber light. In this manner, as disclosed in commonly assigned U.S. Pat. No. 5,803,579, the light emitted from these two LEDs will overlap and form effective white light illumination. The entire disclosure of U.S. Pat. No. 5,803,579 is incorporated herein by reference.

Figure 3:
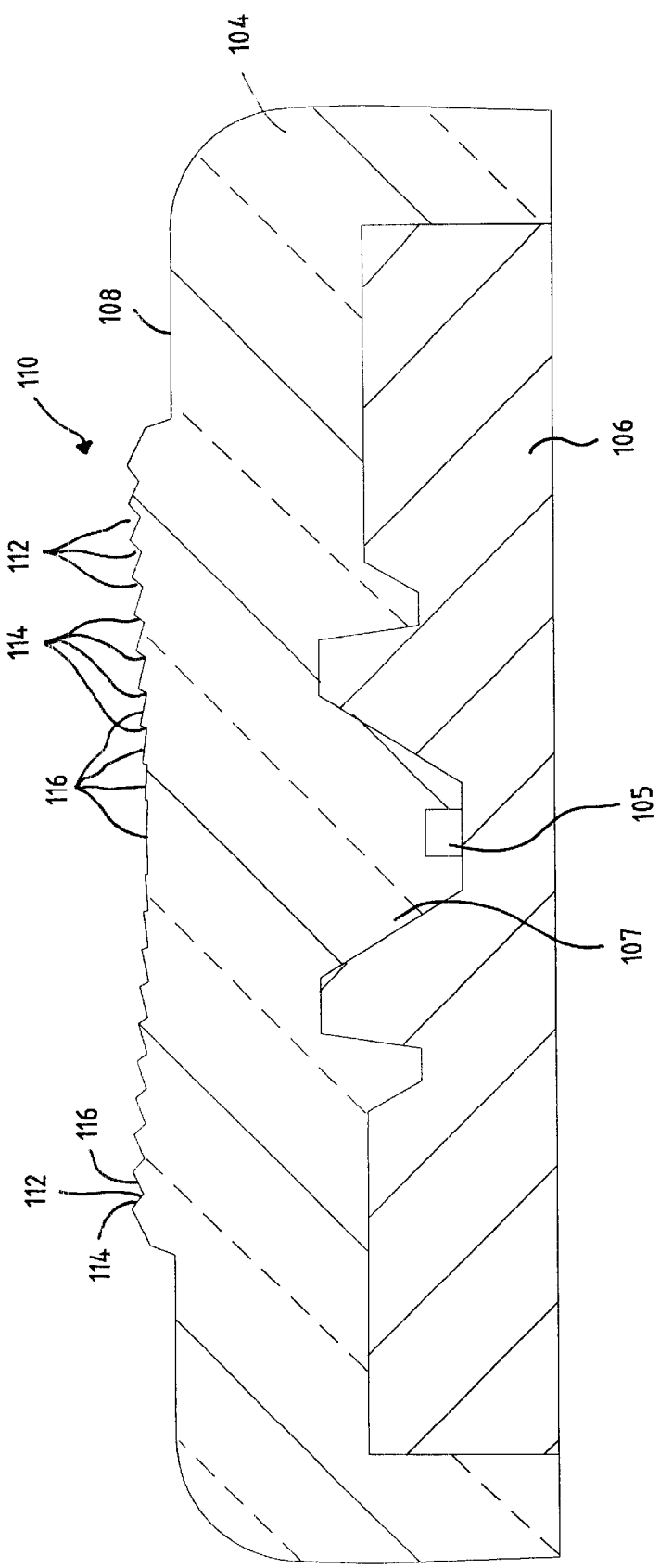
FIG. 3 is a cross-sectional view of the radiation emitter device shown in FIG. 2 taken along line 3–3'.
Figure 4:
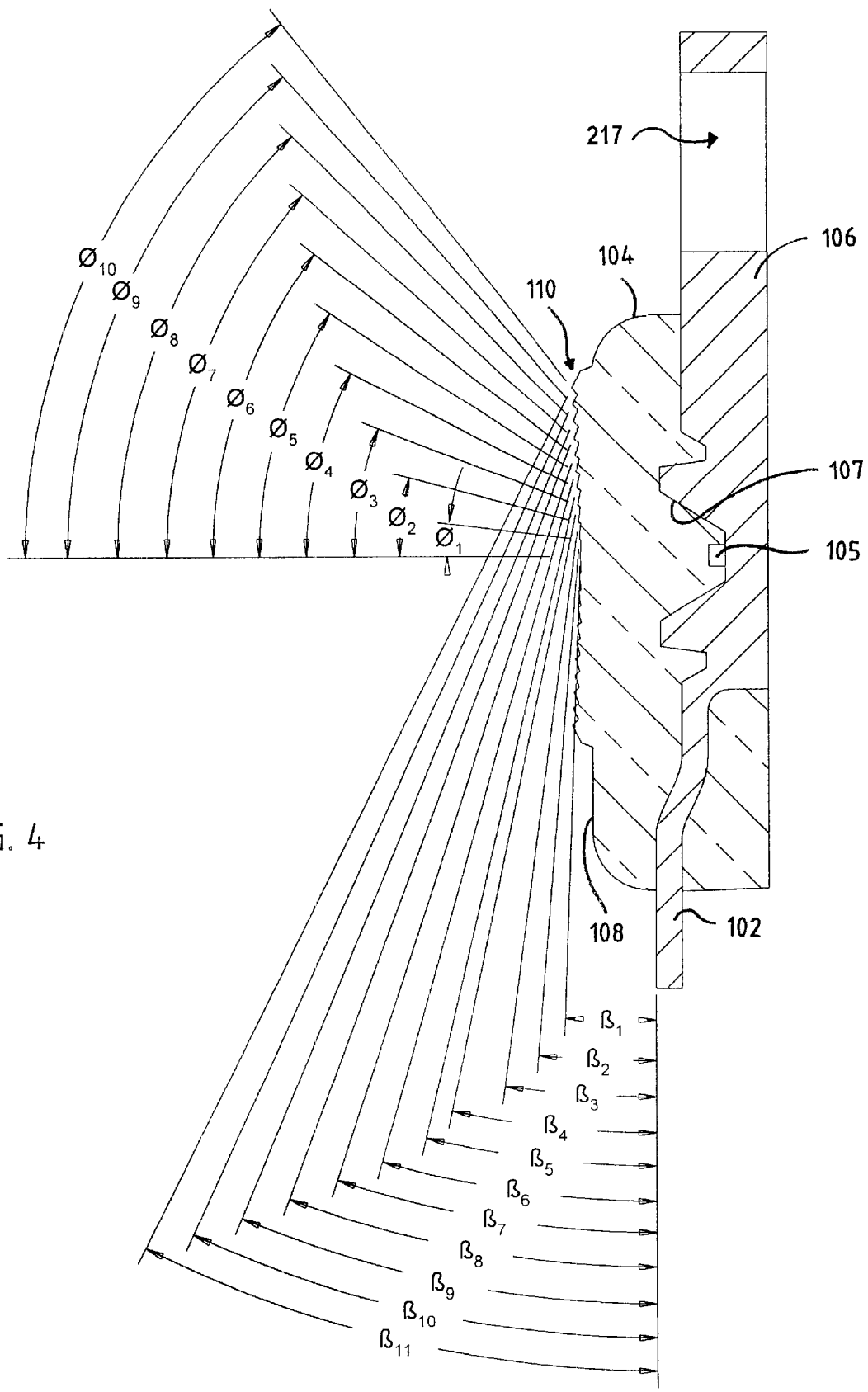
FIG. 4 is a cross-sectional view of the radiation emitter device shown in FIG. 2 taken along line 4—4' showing preferred inclination angles for each of the risers 114.

FIG. 3 is a cross-sectional view of the device 100 taken along line III—III shown in FIG. 2. FIG. 4 is a cross-sectional view of device 100 taken along line IV—IV shown in FIG. 2. As shown in FIGS. 2–4, lens 110 includes a plurality of concentric circular grooves 112. The side walls of the grooves are defined by risers 114 and Fresnel facets 116. Risers 114 are generally straight lines in cross section and are parallel to lines extending to the exit surface from a point in the center of the radiation emitters. In this manner, risers 114 do not substantially modify the light emitted from the radiation emitters. Instead, Fresnel facets 116 modify the light beams to a much greater degree. As discussed above, Fresnel facets 116 are curved differently for each concentric ring defining lines 110. The innermost Fresnel facet of lens 110 is mildly convex-outward and placed so that the radiation source is off the focal plane. This mildly convex surface is then converted to a faceted Fresnel structure. The curve of the Fresnel facets is flattened for each concentric ring moving outward to thereby provide a non-imaging, mildly divergent lens structure.

Figure 5:
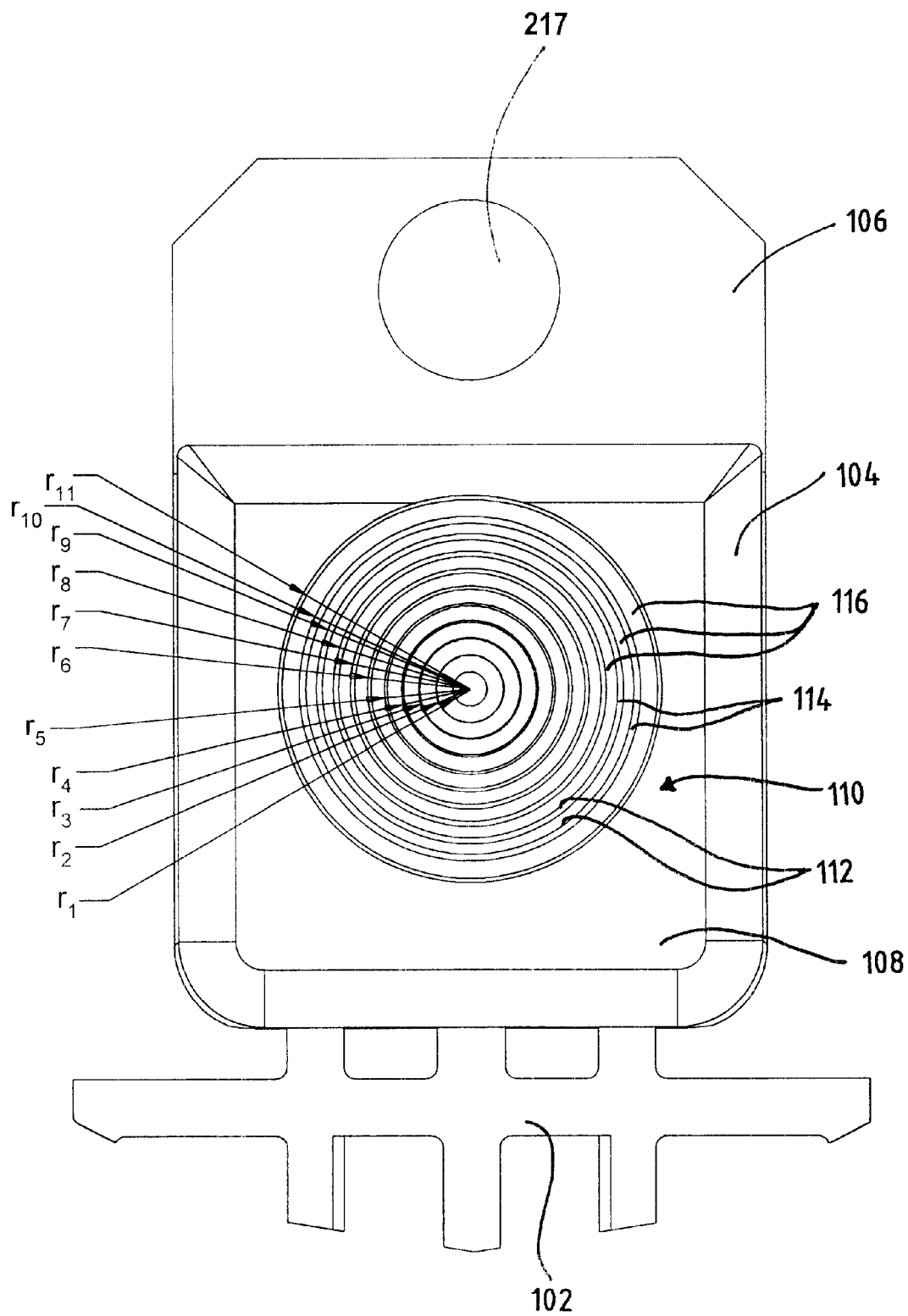
FIG. 5 is a front elevational view of the radiation emitter device shown in FIG. 2.

FIGS. 4 and 5 show a preferred example of the radiation emitter of the present invention. As shown in FIG. 5, each concentric ring of the Fresnel lens has a sequentially labeled radius. The preferred radius of each ring is as follows:

$r_1$=0.3 mm
$r_2$=0.6 mm
$r_3$=0.9 mm
$r_4$=1.2 mm
$r_5$=1.5 mm
$r_6$=1.8 mm
$r_7$=2.1 mm
$r_8$=2.4 mm
$r_9$=2.7 mm
$r_{10}$=3.0 mm
$r_{11}$=3.3 mm

The inclination angles of the risers 114 are preferably selected to be parallel to the light rays from the emitters so as to not optically alter the path of the light rays and to thereby minimize loss. Listed below are preferred inclination angles for each of the risers 114 as shown in FIG. 4 (measured relative to the central optical axis of the lens).

$\varnothing_1$=7.5°
$\varnothing_2$=14.7°
$\varnothing_3$=21.3°
$\varnothing_4$=27.3°
$\varnothing_5$=32.7°
$\varnothing_6$=37.5°
$\varnothing_7$=41.6°
$\varnothing_8$=45.3°
$\varnothing_9$=48.5°
$\varnothing_{10}$=51.3°

The preferred inclination angles of the Fresnel facets 116 as shown in FIG. 4 are listed below and are relative to a plane perpendicular to the optical axis. $\beta_1=2.0°$ $\beta_2=4.7°$ $\beta_3=7.6°$ $\beta_4=11.9°$ $\beta_5=13.3°$ $\beta_6=15.9°$ $\beta_7=18.4°$ $\beta_8=20.7°$ $\beta_9=22.8°$ $\beta_{10}=24.8°$ $\beta_{11}=26.5°$ The number of facets is selected to minimize the groove depth while maintaining machinability. Selecting a greater number of facets decreases groove depth but results in a component that is more difficult to machine.

Figure 6:
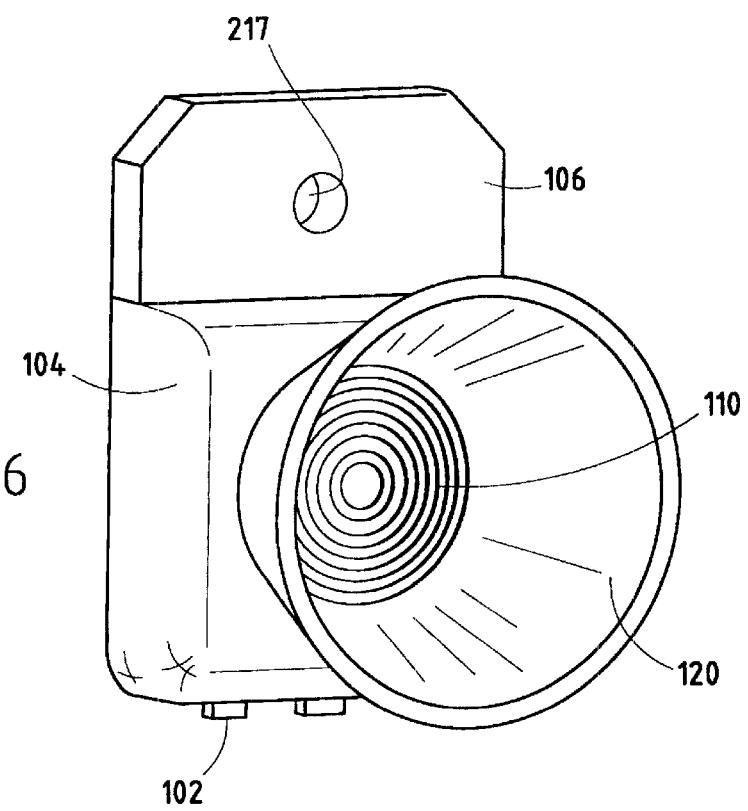
FIG. 6 is a perspective view of a radiation emitter assembly including the radiation emitter device constructed in accordance with the present invention.

As shown in FIG. 6, a secondary optic, such as a parabolic or elliptical reflective cup 120, may be disposed proximate encapsulant 104 and, in certain applications, cup 120 may be secured to encapsulant 104 by means of adhesive or other attachment. As illustrated, the reflector includes an inner aperture that is sized to correspond to the outer extent of lens 110. The curvature of reflector 120 is preferably such that the light emitters are situated at approximately the focal point of reflector 120.

Although the radiation emitter device structure has been described with respect to the structure shown in the drawings and disclosed in U.S. Pat. No. 6,335,548, it will be appreciated that other conventional structures or inventive structures may incorporate the inventive lens 110 and/or secondary optic 120. Examples of some other non-conventional devices with which the inventive optics may be utilized include those disclosed in U.S. Pat. No. 6,521,916, entitled "RADIATION EMITTER DEVICES AND METHOD OF MAKING THE SAME," filed on Jan. 31, 2001, by John K. Roberts et al. and in U.S. patent application Ser. No. 09/835,238, Application Publication No. US 2002-0149312, entitled "HIGH POWER RADIATION EMITTER DEVICE AND HEAT DISSIPATING PACKAGE FOR ELECTRONIC COMPONENTS," filed on Apr. 13, 2001, by John K. Roberts et al. The entire of disclosures of this published patent application and patent are incorporated herein by reference. The '916 patent discloses a device similar to that shown in FIGS. 2–5, but the encapsulant is made of two different materials, with one of the materials optimized for optical output and the other optimized for its thermal properties. By utilizing the above-described microgroove lens structure on a device such as that disclosed above and in the above-referenced '916 patent, the thickness of the encapsulant over the LED chips is significantly reduced thereby lessening the thermal insulating effect of the encapsulant. Thus, the use of the inventive lens structure further improves the thermal characteristics, and hence the performance, of these devices while significantly improving the optical characteristics of the device.

As described in detail in commonly-assigned U.S. Provisional Patent Application No. 60/316,600, entitled "VEHICLE LAMP ASSEMBLY WITH HEAT SINK" and filed on Aug. 31, 2001, by Jeremy A. Walser et al., and in commonly assigned U.S. Provisional Patent Application No. 60/324,551, entitled "VEHICLE LAMP ASSEMBLY WITH HEAT SINK" and filed on Sep. 25, 2001, by Jeremy A. Walser et al., and as shown in FIGS. 6–10, one or more of the radiation emitter devices may be incorporated into a lamp assembly 210 which further includes a secondary lens 240. The entire disclosures of these applications are incorporated herein by reference. Secondary lens 240 is preferably formed of a transparent plastic material and is configured to fit within aperture 252 formed in the bottom of a mirror housing 250. For this purpose, secondary lens 240 includes fingers 242 that catch an upper edge within aperture 252 and a plurality of resilient legs 244 on an opposite side for snapping into place within aperture 252. Secondary lens 240 is preferably formed of a thickness to allow lens 240 to be mounted flush with the outer bottom surface of housing 250. Reflector 220 may be formed to have a plurality of recesses 228 (FIG. 11) corresponding in position and size to legs 244 of secondary lens 240 to allow a flush mount of both lens 240 and reflector 220 with housing 250.

As best shown in FIGS. 8 and 9, secondary lens 240 includes a first lens portion 246 and a second lens portion 248. First lens portion 246 includes an optical deviator for deviating the direction at which light is emitted from the bottom of the lamp assembly slightly towards the rear of the vehicle so as to be projected onto at least a portion of the driver's lap as well as a portion of any center console that may be present in the vehicle. Second lens portion 248 also includes an optical deviator, which is configured to redirect the light from its associated two LEDs slightly to the rear of the vehicle and to the right of the map light assembly onto the lap of the front passenger, if present. The deviators are preferably formed as a plurality of parallel angled facets in the inside surface of the lens such that the outside surface of the lens may be relatively smooth. Secondary lens 240 may include a slightly roughened outside or inside surface so as to slightly diffuse the light emitted from the associated LEDs. It will be appreciated by those skilled in the art that mirror housing 250 may be formed of either an opaque material or may be formed of a partially transparent material such that secondary lens 240 may be integrally formed within housing 250. Similar transparent mirror housings are disclosed in commonly assigned U.S. patent application Ser. No. 09/900,500, Application Publication No. US 2002-0024713, the entire disclosure of which is incorporated herein by reference.

As best shown in FIGS. 8 and 9, vehicle lamp assembly 210 includes an LED subassembly 212, which includes a printed circuit board 214 to which a plurality of LEDs 100 is electrically and physically connected. The LEDs are preferably physically secured to printed circuit board 214 such that their central optical axes along which they emit light are disposed substantially non-perpendicular to the surface of printed circuit board 214 to which the LEDs are mounted. The LEDs are preferably soldered to the circuit board using conventional techniques. LEDs 100 are preferably constructed with heat extraction members in accordance with the teachings of U.S. Pat. No. 6,335,548, the entire disclosure of which is incorporated herein by reference. These LEDs each also preferably include at least two LED chips including a chip that emits amber light and a chip that emits blue-green light such that the light emitted by these differently colored chips is simultaneously emitted from the LED and mixes to form effective white light. Methods and implementations for forming effective white light by mixing the light from two or more LEDs are disclosed in commonly assigned U.S. Pat. No. 5,803,579, the entire disclosure of which is incorporated herein by reference. The LEDs 100 also preferably include a lens integrally formed within the LED encapsulant. Preferably, the lens provided on each LED 100 is a microgroove or Fresnel lens as disclosed above.

Although not shown in the drawings, a connector plug is preferably provided at one end of printed circuit board 214 for connection to switches or another drive circuit for selective activation of LEDs 100. Of the four LEDs 100 that are shown in the drawings, two may be used to produce light that is projected onto the lap of the front passenger while the other two may be used to project light generally towards the driver's lap. Accordingly, these LEDs may be separately activated or may be activated simultaneously using a single switch or a combination of switches provided on the rearview mirror assembly or elsewhere in the vehicle.

Lamp assembly 210 further includes secondary reflector 220, which includes a plurality of reflective cups 120 corresponding in number to the number of LEDs 100. Reflective cups 120 may have any conventional shape and are provided to direct as much light as possible that is emitted from LEDs 100 in a generally downward direction. Reflector 220 may be formed of plastic and may have metalized surfaces to provide reflective cups 120. Reflector 220 also preferably includes a first set of heat stake pegs 224 and a second set of heat stake pegs 226 that extend upward from the top portion of reflector 220. As shown in the drawings, the first set of heat stake pegs 224 is configured and aligned with apertures 217 formed in each of the heat extraction members 106 of LEDs 100. The second set of heat stake pegs 226 is positioned and aligned to extend between LEDs 100. The reflector may include slots on its upper edges such that the upper edges of LEDs 100, when attached to reflector 220, are flush with the upper edges of reflector 220. By providing and configuring heat stake pegs 224 and 226 to extend through and between LEDs 100, the central optical axes of the LEDs may be properly registered and aligned with the centers of the reflective cups. Each of the LEDs 100 includes several leads 102 having standoffs that ensure consistent insertion depth of the LEDs in the holes provided in circuit board 214. This, in turn, ensures that apertures 217 of each of LEDs 100 are located the same distance from circuit board 214 thereby aiding in the registration process.

As shown in the drawings, lamp assembly 210 further includes a mounting plate 230 that is secured to the top of the lamp assembly and to the backs of LEDs 100. Preferably, mounting plate 230 is made of a material having a high thermal conductivity so as to not only function as a mounting plate, but also function as a heat sink for LEDs 100. As best shown in FIG. 7, mounting plate 230 includes a lamp mounting portion 232 and a mirror mounting portion 234, which are angled with respect to one another to ensure proper mounting within a mirror housing 250. Lamp mounting portion 232 preferably includes a first set of apertures 236 corresponding in size and position to apertures 217 in LED 100 and the first set of heat stake pegs 224 of reflector 220. Lamp mounting portion 232 further includes a second set of apertures 238 that correspond in position to the second set of heat stake pegs 226. Thus, mounting plate 230 may be slid onto heat stake pegs 224 and 226 and, subsequently, the heat stake pegs may be thermally deformed causing them to expand on their distal end and thereby secure mounting plate 230 to reflector 220 with LED subassembly 212 sandwiched in between.

As apparent from the drawing figures, mounting plate 230 is physically in contact with the backs of LEDs 100 and is in thermal contact with the heat extraction members 106 of LEDs 100 so as to provide a thermal path from the LEDs. Such heat sinking allows the LEDs to be driven at greater current levels to thereby emit more light. To increase thermal transfer between the heat extraction members of the LEDs and the mounting plate, a silicon RTV heat sink compound may be provided therebetween.

Reliability of electronic components (including discrete LED components) improves almost exponentially with operating temperature reduction. This is particularly true of LEDs in which the $T_g$ of the clear encapsulation/mold compounds used place relatively firm absolute limits on the maximum internal temperature allowed for each device (typically, 110–130° C., depending on the material). With automotive interior operating temperature specifications reaching 85° C., the temperature difference permissible for the LED optical material limit becomes even more critical. By utilizing an integral microgroove lens on the LEDs rather than a larger, more bulky conventional lens, the distance between the LED chip(s) and the outside environment is substantially reduced, thereby increasing the thermal dissipation properties of the LEDs.

With reference to FIG. 7, mirror mounting portion 234 of mounting plate 230 includes first and second apertures 235 for engaging mounting pegs 254 that extend forwardly of the inner rear wall of mirror housing 250 on opposite sides of a central aperture 255 provided in the center of the rear wall of housing 250. Central aperture 255 receives a center mounting post 262 of a double ball mount stem 264 of mirror mounting structure 260. A third aperture 237 is provided in mounting plate 230 in between first and second apertures 235 for also receiving a portion of post 262. A fourth aperture 239 is provided in mounting plate 230 for receipt of a rotation prevention post 266 that extends from an off-axis location on a mounting washer 268 at the end of mirror stem 264. Post 266 extends through an aperture 257 provided in the rear wall of mirror housing 250 and through aperture 239. Post 266 prevents rotation of the mirror housing with respect to the rear end of the first mounting ball. Rotation, however, is permitted by rotation of the ball within a sleeve of the mounting stem 264. As shown in FIG. 7, the mounting structure 260 further includes a mounting shoe 269 that is secured to the interior surface of a windshield. It will be appreciated, however, that mirror mounting structure 260 may have any form including a single ball structure or a structure that mounts to the roof of the vehicle rather than to the inside surface of the vehicle windshield.

While the vehicle lamp assembly is described herein as functioning as a map lamp provided on or within a rearview mirror assembly, it will be appreciated by those skilled in the art that this lamp assembly or certain aspects of the disclosed lamp assembly may be utilized in other lamp modules whether used in a vehicle or elsewhere. For example, lamp assemblies incorporating the inventive radiation emitter devices could be used in an overhead console, a windshield console, a sun visor, in a headliner, door panels, etc. of a vehicle. Likewise, the radiation emitter devices of the present invention may be employed in any non-vehicle application.

The above description is considered that of the preferred embodiment only. Modifications of the invention will occur to those skilled in the art and to those who make or use the invention. Therefore, it is understood that the embodiment shown in the drawings and described above is merely for illustrative purposes and not intended to limit the scope of the invention, which is defined by the following claims as interpreted according to the principles of patent law, including the doctrine of equivalents.

What is claimed is:

1. A discrete radiation emitter device comprising:
   at least two radiation emitters emitting radiation of different wavelengths;
   a leadframe including a heat extraction member in thermal contact with at least one of said radiation emitters, said leadframe further including first and second electrical leads electrically coupled to at least one of said radiation emitters; and
   an encapsulant configured to encapsulate said radiation emitters and a portion of said first and second electrical leads, said heat extraction member extending out from said encapsulant to provide a first thermal path from at least one of said radiation emitters, said first thermal path being separate from a second thermal path provided by said first and second electrical leads, said encapsulant further configured to have a surface defining an optical lens including a plurality of concentric circular grooves, wherein said optical lens is a divergent lens; and wherein said first thermal path provided by said heat extraction member has a lower thermal resistance than said second thermal path provided by said electrical leads.

2. The radiation emitter device of claim 1, wherein said lens is a multi-faceted Fresnel lens structure having a plurality of risers and Fresnel facets defining the plurality of concentric circular grooves.

3. The radiation emitter device of claim 1, wherein said radiation emitters are LED chips.

4. A radiation emitter assembly comprising:
   at least one discrete radiation emitter device comprising:
      at least two radiation emitters emitting radiation of different wavelengths;
      a leadframe including a heat extraction member in thermal contact with at least one of said radiation emitters, said leadframe further including first and second electrical leads electrically coupled to at least one of said radiation emitters; and
      an encapsulant configured to encapsulate said radiation emitters and a portion of said first and second electrical leads, said heat extraction member extending out from said encapsulant to provide a first thermal path from at least one of said radiation emitters, said first thermal path being separate from a second thermal path provided by said first and second electrical leads, said encapsulant further configured to have a surface defining a divergent optical lens; and
   a secondary reflective cup disposed proximate said divergent optical lens of said radiation emitter device; and
   wherein said first thermal path provided by said heat extraction member has a lower thermal resistance than said second thermal path provided by said electrical leads.

5. The radiation emitter assembly of claim 4, wherein said secondary reflective cup is positioned about the periphery of said divergent optical lens such that said reflective cup reflects radiation emitted from said divergent optical lens.

6. The radiation emitter assembly of claim 4, wherein said divergent optical lens includes a plurality of concentric circular grooves.

7. The radiation emitter assembly of claim 4, wherein said secondary reflective cup is parabolic.

8. The radiation emitter assembly of claim 4, wherein said secondary reflective cup is elliptical.

9. The radiation emitter assembly of claim 4 and further including a secondary lens disposed at an opposite end of said secondary reflective cup from said discrete radiation emitter device.

10. The radiation emitter assembly of claim 4, wherein said radiation emitter assembly is a vehicle lamp assembly, which further comprises a mounting mechanism for mounting the vehicle lamp assembly to a component of a vehicle.

11. A map lamp assembly for a vehicle rearview mirror, said map lamp assembly comprising:
    at least one discrete radiation emitter device comprising:
       at least two radiation emitters emitting radiation of different wavelengths;
       a leadframe including a heat extraction member in thermal contact with at least one of said radiation emitters, said leadframe further including first and second electrical leads electrically coupled to at least one of said radiation emitters; and
       an encapsulant configured to encapsulate said radiation emitters and a portion of said first and second electrical leads, said heat extraction member extending out from said encapsulant to provide a first thermal path from at least one of said radiation emitters, said first thermal path being separate from a second thermal path provided by said first and second electrical leads, said encapsulant further configured to have a surface defining a divergent optical lens; and
    a secondary reflective cup disposed proximate said divergent optical lens of said radiation emitter device; and
    wherein said first thermal path provided by said heat extraction member has a lower thermal resistance than said second thermal path provided by said electrical leads.

12. The map lamp assembly of claim 11, wherein said secondary reflective cup is positioned about the periphery of said divergent optical lens such that said reflective cup reflects radiation emitted from said divergent optical lens.

13. The map lamp assembly of claim 11, wherein said divergent optical lens includes a plurality of concentric circular grooves.

14. The map lamp assembly of claim 11, wherein said secondary reflective cup is parabolic.

15. The map lamp assembly of claim 11, wherein said secondary reflective cup is elliptical.

16. The map lamp assembly of claim 11 and further including a secondary lens disposed at an opposite end of said secondary reflective cup from said discrete radiation emitter device.

17. The radiation emitter device of claim 1, where at least one of said radiation emitters is an LED chip.

* * * * *